United States Patent
Holscher et al.

(10) Patent No.: US 6,403,285 B1
(45) Date of Patent: Jun. 11, 2002

(54) METHOD FOR EXPOSING SEMICONDUCTOR WAFERS IN A MANNER THAT PROMOTES RADIAL PROCESSING UNIFORMITY

(75) Inventors: Richard D. Holscher; Linda K. Somerville, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/466,364

(22) Filed: Dec. 17, 1999

(51) Int. Cl.[7] .................................................. G03F 7/20
(52) U.S. Cl. ..................... 430/311; 430/313; 430/394; 430/396
(58) Field of Search ................................ 430/311, 313, 430/394, 396

(56) References Cited

U.S. PATENT DOCUMENTS

| | | | |
|---|---|---|---|
| 5,467,166 A | * 11/1995 | Shiraishi | 355/71 |
| 5,688,409 A | * 11/1997 | Dao et al. | 216/48 |
| 5,691,803 A | * 11/1997 | Song et al. | 355/55 |
| 5,835,227 A | * 11/1998 | Grodnensky et al. | 356/399 |
| 5,943,550 A | * 8/1999 | Fulford, Jr. et al. | 438/14 |
| 5,958,656 A | * 9/1999 | Nakao | 430/394 |
| 6,218,089 B1 | * 4/2001 | Pierrat | 430/394 |

FOREIGN PATENT DOCUMENTS

JP         2000-77311       *  3/2000

* cited by examiner

*Primary Examiner*—Mark F. Huff
*Assistant Examiner*—Nicole Barreca
(74) *Attorney, Agent, or Firm*—Dorsey & Whitney LLP

(57) ABSTRACT

A stepper device and method of using the stepper device in which a light source in the stepper generates an annular or multipole pattern of light having a relatively large coherency value that is used to expose inner fields of a photoresist-coated wafer. The light source generates an annular or multipole pattern of light having a relatively small coherency that is used to expose outer fields of the wafer adjacent its edge. The use of light having a relatively small coherence value to expose the outer fields of the wafer causes the exposure width of isolated features to be relatively large compared to the exposure width of dense features. As a result, after etching, the isolated features and the dense features can have the same width since etching is more effective for dense features.

32 Claims, 3 Drawing Sheets

METHOD FOR EXPOSING SEMICONDUCTOR WAFERS IN A MANNER THAT PROMOTES RADIAL PROCESSING UNIFORMITY

TECHNICAL FIELD

This invention relates to semiconductor photolithography, and more particularly, to a method and apparatus for controlling photolithography exposures to minimize process variations at the edges of wafers.

BACKGROUND OF THE INVENTION

As the performance requirements of semiconductor devices continue to increase, it is becoming ever more important to control process variations. Critical dimension ("CD") variations across the surface of a wafer can significantly impact manufacturing yields and increase performance variations. As a result, it is important to maintain good CD control. As device geometries shrink, a higher degree of control is required. For example, although 10% control over the critical dimension may be acceptable with 0.35 μm processes, 5% control may be required with 0.18 μm processes.

Although critical dimension control can be difficult at any location on a wafer, it can be particularly challenging near the edge of the wafer. Variations in the critical dimension are therefore more difficult to control near the edges of wafers, primarily because of etch loading, non-uniformities in the thickness of photoresists or films coating the wafer, variations in the intensity of light reflected from the wafer, variations in the amount of material removed by chemical mechanical planarization ("CMP"), and non-uniformity of resist developing, all of which occur to a greater extent near the edge of the wafer. Excessive variations of the critical dimension resulting from these or other factors are most commonly found in isolated features, such as lines, since dense features generally have more process latitude.

The problem of controlling critical dimension variations, particularly near the wafer edge, has been recognized, but no entirely satisfactory solution has been developed. An article by Ackmann et al. entitled *"Use Of Exposure Compensation To Improve Performance For Speed And Binning Based On Electrical Parameter Feedback Into Fabrication Design,"* SPIE Vol. 3051, pp. 384–89, describes an "Exposure Compensation" approach to controlling critical dimension variations. In Exposure Compensation, the power or dosage of the light source used to expose a photoresist coated wafer through a reticule is reduced near the edge of the wafer. Light at a higher power or dosage is then used to expose the remainder of the wafer. The light dosage may be adjusted by adjusting the intensity of the light, by adjusting the length of the exposure, or by making both adjustments. The use of lower light dosage at the wafer edge makes the width of lines and other features formed in a layer of photoresist coating the wafer wider at the wafer edges for positive tone resist. However, since etching of the resist after developing the resist is sometimes higher at the edge of the wafer, the width of lines and other features formed near the edge of the wafer can have the same width as lines and features formed by exposing other portions of the wafer using a higher light dosage. Although this Exposure Compensation technique may improve critical dimension uniformity at the wafer edge, it tends to affect both isolated features and dense features equally. Yet isolated features and dense features formed by photolithography are not etched in the same manner. If isolated features and dense features have the same exposure width, after etching the isolated features to the correct width, the dense features may be too wide. Conversely, if the dense features are etched to the correct width, the isolated features may be too narrow.

There is therefore a need for a photolithographic technique that can be used to limit critical dimension variations by exposing inner and outer fields of the wafer differently, but does so in a manner that affects isolated features and dense features differently at the wafer edge so that both dense and isolated features formed in the resist can have the correct widths near the wafer edge.

SUMMARY OF THE INVENTION

A method and apparatus for exposing a resist-coated semiconductor wafer to form features on the wafer. Inner fields of the wafer are exposed using light from a light source having a first characteristic that is unrelated to light intensity, such as a coherency value. Outer fields of the wafer adjacent the edge are exposed using light from the light source having a second characteristic that is also unrelated to light intensity, such as a coherency value. The light from the light source may have a variety of configurations, such as annular or multipole. The configuration of light used to expose the inner fields of the wafer preferably has a coherency value that is greater than the coherency value of the light that is used to expose the outer fields of the wafer. As a result, the widths of all features formed in the resist are larger at the edge than they would be toward the center of the wafer. However, after etching, widths of the features formed in the resist are similar across the surface of the wafer because etching is more effective at the edge of the wafer.

DETAILED DESCRIPTION OF THE INVENTION

Figure 1:
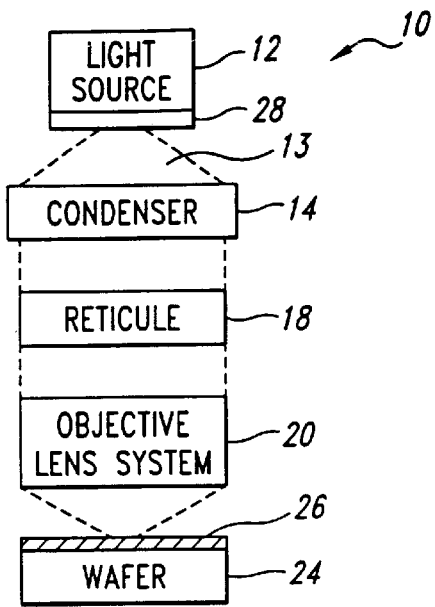
FIG. 1 is a schematic view illustrating a photolithography stepper according to one embodiment of the invention.

A typical method and apparatus for patterning semiconductor wafers using photolithography according to one embodiment of the invention is shown in FIG. 1. The apparatus, commonly known as a "stepper" or "scanner" 10, includes a conventional light source 12 that directs a beam of light 13 through a conventional condenser 14 onto a reticule 18. The light passing through the reticule 18 passes through a conventional objective lens system 20 and is incident on a field on the surface of a semiconductor wafer 24 that has been coated with a layer of photoresist 26. As is well known in the art, the reticule 18 contains an opaque pattern corresponding to the features that are to be formed in the resist 26, if the wafer 24 is coated with a positive resist 26. After each field corresponding to a respective chip is exposed, the position of the wafer is incrementally advanced by incrementally moving a stage (not shown) supporting the wafer 24. A field of the wafer 24 is then exposed and the stage is incremented until all fields of the wafer 24 have been exposed. If the wafer 24 is coated with a negative resist 26, the opaque pattern corresponds to the negative of the features that are to be formed in the resist 26. In either case, after the resist 26 has been exposed in the stepper 10, the resist 26 is developed which removes the exposed resist in the case of positive resist or unexposed resist in the case of negative resist.

Figure 2:
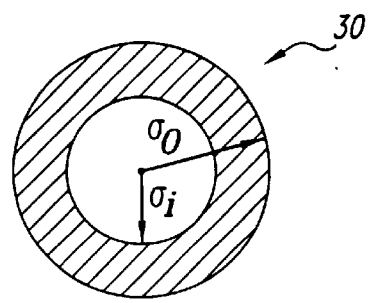
FIG. 2 is a schematic drawing illustrating a light pattern conventionally formed by a light source in a stepper.

Although the above-described components of the stepper 10, are conventional, the stepper 10 also includes a light control device 28 that controls the characteristics, such as intensity, of light 13 emanating from the light source 12. The light source 12 can be an "off-axis" light source in which the center of the light emanating from the light source is masked. The light generated by the light source 12 may thus have an annular pattern 30, as shown in FIG. 2. As will be understood by one skilled in the art, the pattern 30 corresponds to the pattern of light 13 emanating from the light source 12. The pattern of the light from the light 13 source 12 may be characterized by its coherency, which is designated by a coherency value "σ". A point light source has a σ of 0, while an infinitely wide light source has a σ of infinity. Generally, reducing the σ of a light source will cause the width of isolated features to increase to a greater degree than the increase in the width of dense features. Thus, the width of isolated features will increase while the width of dense features will remain relatively constant. Although a specific implementation of the light control device 28 is not described herein in the interest of brevity, suitable masking or other techniques will be apparent to one skilled in the art of stepper design. It will also be understood that the stepper contains a number of other components. However, since these other components are somewhat peripheral to the disclosed invention, an explanation of their structure and operation has been omitted in the interest of brevity.

The light pattern 30 shown in FIG. 2 may also be characterized by σ, in which $\sigma_o$ characterizes the outer radius of the light pattern 30 and $\sigma_i$ characterizes the inner radius of the light pattern 30. The stepper 10 allows the light from the light source 12 to be "optically tuned" to select values of $\sigma_o$ and $\sigma_i$, as is well known in the art. Using a light source having a smaller outer diameter, i.e., a smaller $\sigma_o$, will cause the width of isolated features to increase to a greater degree than the width of dense features.

Figure 3:
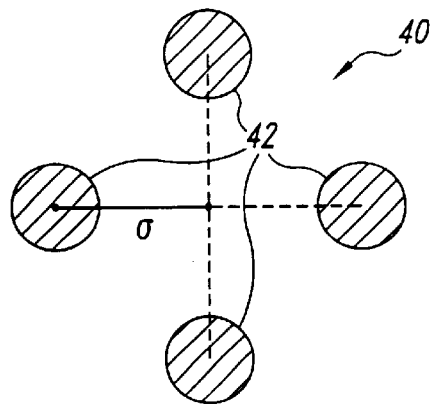
FIG. 3 is a schematic drawing illustrating another light pattern conventionally formed by a light source in a stepper.

Another pattern 40 that is conventionally generated by the light source 12 in the stepper 10 is shown in FIG. 3. This light pattern 40, known as "quadrupole" light, consists of four discrete light beams 42. The quadrupole light pattern 40 may also be characterized by σ, in which σ characterizes the distance from the center of the pattern 40 to the center of an individual light beam 42.

Although two specific patterns 30, 40 formed by the light source 12 in the stepper 10 are shown in FIGS. 2 and 3, respectively, it will be understood that the light source 12 may form other patterns (not shown) that can be used to implement various embodiments of the invention.

Figure 4A:
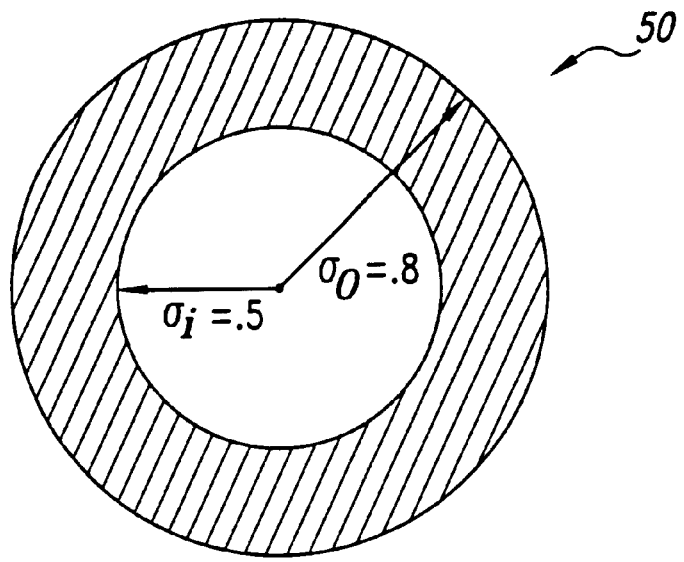
FIGS. 4A and 4B are schematic drawings illustrating light patterns that can be used to expose the outer and inner portions, respectively, of the wafer according to one embodiment of the invention.

In accordance with one embodiment of the invention, the inner fields of the wafer 24 (FIG. 1) are exposed using the light pattern 50 shown in FIG. 4A to illuminate the reticule 18. The pattern 50 is shown in FIG. 4A as having a si of 0.5. and a so of 0.8. However, it will be understood that other values of so and si may be used. Additionally, light patterns other than the light pattern 50 shown in FIG. 4A may be used.

Figure 4B:
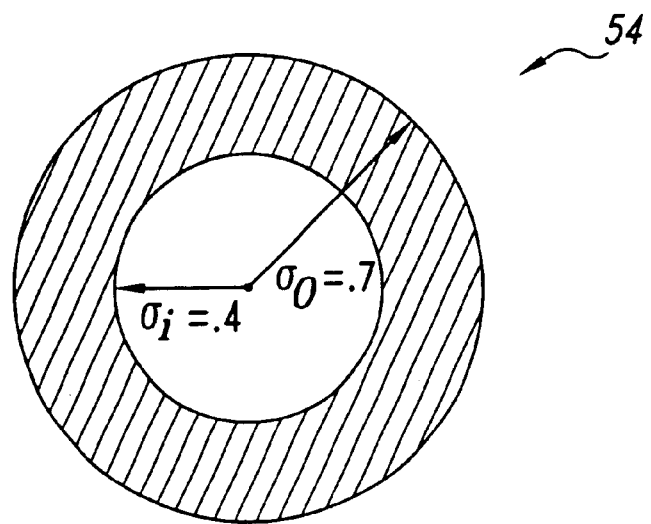

After the inner fields of the wafer 24 have been exposed using the light pattern 50, the outer fields of the wafer 24 near the wafer edge are exposed using the light pattern 54 shown in FIG. 4B to illuminate the reticule 18. The pattern 54 is shown in FIG. 4B as having a si of 0.4. and a so of 0.7. However, other values of so and si and other light patterns may be used.

By using one pattern of light to expose the inner fields of the wafer 24 and using a different pattern of light to expose the outer fields of the wafer 24, the inner fields of the wafer 24 can be treated differently than the outer fields of the wafer 24 to compensate for differences in the process variables as a function of radius, as described above. Specifically, the outer fields of the wafer 24 can be exposed with a lower light dosage thereby causing lines and other features formed by the resist to be wider. However, since etching is more effective at the edges of the wafer 24 than it is toward the center, equal width features etched in the wafer 24 will have the same width regardless of their location on the wafer 24. Significantly, however, the inner and outer fields of the wafer 24 may be exposed differently while still allowing the light pattern to be selected in a manner that causes the isolated features to be exposed differently from the dense features. More specifically, as the coherency σ of the light is decreased, the width of lines and other features may be increased by 10–20 nm depending on the size and density of the features. The exposed widths of isolated features will increase faster than the exposed widths of dense features. As a result, using light having a relatively low coherency to expose the edge fields of the wafer 24 results in isolated features having an increased width as compared to the width of isolated features in the center of fields of the wafer. However, after etching, isolated features in the edge fields of the wafer and isolated features in the center fields of the wafer may have the same width.

Figure 5A:
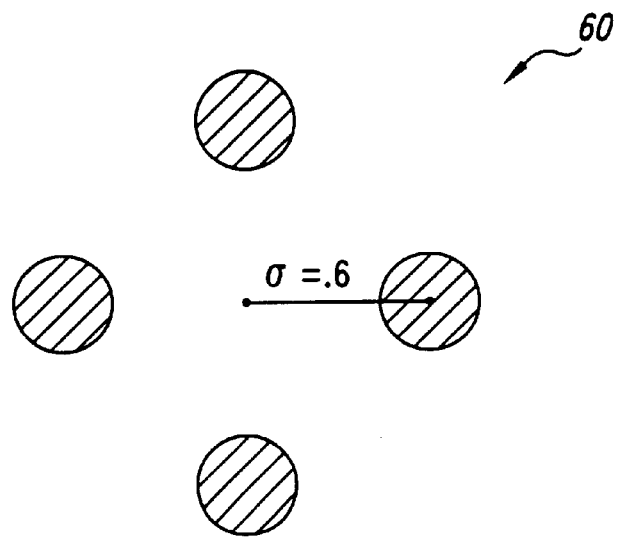
FIGS. 5A and 5B are schematic drawings illustrating another set of light patterns that can be used to expose the outer and inner portions, respectively, of the wafer according to another embodiment of the invention.

In another embodiment of the invention, the outer fields of the wafer 24 near the wafer edge are exposed using the quadrupole light pattern 60 shown in FIG. 5A to illuminate the reticule 18. The pattern 60 is shown in FIG. 5A as having a s of 0.6. However, it will be understood that other values of s may be used.

Figure 5B:
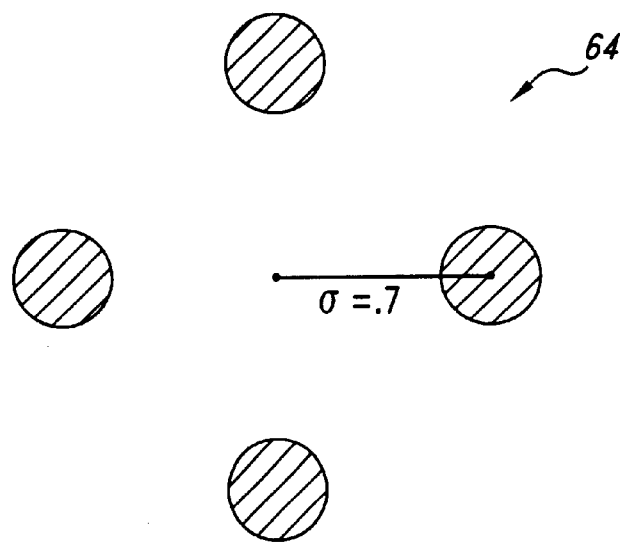

After the outer fields of the wafer 24 have been exposed using the light pattern 60, the inner fields of the wafer 24 are exposed using the light pattern 64 shown in FIG. 5B. The pattern 64 is shown in FIG. 5B as having a σ of 0.7. However, other values of σ may be used. Also, although a quadrupole light source is shown being used in FIGS. 5A and B, it will be understood that light source having a greater or lesser number of poles can be used. Also, as mentioned above, light sources having patterns other than annular or multipole may be used.

From the foregoing it will be appreciated that, although specific embodiments of the invention have been described herein for purposes of illustration, various modifications may be made without deviating from the spirit and scope of the invention. For example, although each of the disclosed embodiments describe a specific order to exposing the inner fields of the wafer 24 and exposing the outer fields of the wafer 24, it will be understood that the different fields of the wafer 24 may be exposed in any order. Also, the light dosage, i.e., combination of light intensity and exposure duration, may be the same for both exposures, or they may be different. Accordingly, the invention is not limited except as by the appended claims.

What is claimed is:

1. A method of exposing a resist coated semiconductor wafer, the method comprising:

exposing inner fields of the wafer using a first light source having a first value of a characteristic other than light intensity; and exposing outer fields of the wafer that are located adjacent to the edge of the wafer using a second light source having a second value of the characteristic other than light intensity, the first and second values being different from each other.

2. The method of claim 1 wherein the first and second light sources each comprise a light source having an annular pattern.

3. The method of claim 2 wherein the first light source comprises a light source having an outer coherency value that is greater than the outer coherency value of the second light source.

4. The method of claim 3 wherein the first light source comprises a light source having an outer coherency value of 0.8 and an inner coherency value of 0.5, and wherein the second light source comprises a light source having an outer coherency value of 0.7 and an inner coherency value of 0.4.

5. The method of claim 1 wherein the first and second light sources each comprise a light source having a multipole light pattern.

6. The method of claim 5 wherein the multipole patterns of the first and second light sources comprise respective quadrupole light patterns.

7. The method of claim 6 wherein the first light source comprises a light source having a coherency value of 0.7, and the second light source comprises a light source having a coherency value of 0.6.

8. The method of claim 1 wherein the characteristic other than light intensity comprises a coherency value, and wherein the first and second values of the characteristic comprise respective first and second coherency values, the second coherency value being smaller than the first coherency value.

9. The method of claim 8 wherein the first coherency value comprises a coherency value of 0.7, and wherein the second coherency value comprises a coherency value of 0.6.

10. A method of forming isolated and dense features on a semiconductor wafer, comprising:

coating the wafer with a resist;

exposing inner fields of the wafer using a first light source, the first light source producing patterns in the resist corresponding to isolated features and dense features, the ratio between the width of the patterns corresponding to isolated features and the width of the patterns corresponding to dense features having a first value;

exposing outer fields of the wafer that is located adjacent the edge of the wafer using a second light source, the second light source producing patterns in the resist corresponding to isolated features and dense features, the ratio between the width of the patterns corresponding to isolated features and the width of the patterns corresponding to dense features having a second value that is greater than the first value; and developing the inner and outer fields of the wafer to form the isolated and dense features.

11. The method of claim 10 wherein the first and second light sources each comprise a light source having an annular pattern.

12. The method of claim 11 wherein the first light source comprises a light source having an outer coherency value that is greater than the outer coherency value of the second light source.

13. The method of claim 12 wherein the first light source comprises a light source having an outer coherency value of 0.8 and an inner coherency value of 0.5, and wherein the second light source comprises a light source having an outer coherency value of 0.7 and an inner coherency value of 0.4.

14. The method of claim 10 wherein the first and second light sources each comprise a light source having a multipole light pattern.

15. The method of claim 14 wherein the multipole patterns of the first and second light sources comprise respective quadrupole light patterns.

16. The method of claim 15 wherein the first light source comprises a light source having a coherency value of 0.7, and the second light source comprises a light source having a coherency value of 0.6.

17. The method of claim 10 wherein the first light source comprises a light source having a first coherency value, and wherein the second light source comprises a light source having a second coherency value that is smaller than the first coherency value.

18. The method of claim 17 wherein the first light source comprises a light source having a coherency value of 0.7, and wherein the second light source comprises a light source having a coherency value of 0.6.

19. The method of claim 10 wherein the acts of exposing the inner fields of the wafer using a first light source and exposing the outer fields of the wafer using a second light source comprise exposing the inner and outer fields of the wafer with different light doses.

20. A method of exposing a resist coated semiconductor wafer, comprising:

exposing a first fields of the wafer using light from a light source;

changing the optical tuning of the light source by altering the coherency of the light from the light source; and exposing a second field of the wafer using light from the light source, one of the first and second fields being near the edge of the wafer and the other of the first and second fields being away from the edge of the wafer.

21. The method of claim 20 wherein the first field of the wafer comprises a center field of the wafer and the second field of the wafer comprises a field near the edge of the wafer.

22. The method of claim 21 wherein the act of changing the optical tuning of the light source comprises decreasing the coherency of the light source prior to exposing the second field of the wafer.

23. The method of claim 20 wherein the first field of the wafer comprises the field of the wafer near the edge of the wafer and the second field of the wafer comprises a center field of the wafer.

24. The method of claim 23 wherein the act of changing the optical tuning of the light source comprises increasing the coherency of the light source prior to exposing the second field of the wafer.

25. The method of claim 20 wherein the acts of exposing the first and second fields of the wafer using light from the light source comprises exposing the first and second fields of the wafer using light from the light source having an annular pattern.

26. The method of claim 25 wherein the pattern of light from the light source used to expose the field near the edge of the wafer comprises a pattern of light having a coherency value that is less than the coherency value of light used to expose the field away from the edge of the wafer.

27. The method of claim 26 wherein the pattern of light from the light source used to expose the field away from the edge of the wafer comprises a pattern of light having a coherency value of 0.7 and the pattern of light from the light source used to expose the field near the edge of the wafer comprises a pattern of light having a coherency value of 0.6.

28. The method of claim 20 wherein the acts of exposing the first and second fields of the wafer using light from the light source comprises exposing the first and second fields of the wafer using light from the light source having a multipole pattern.

29. The method of claim 28 wherein the acts of exposing the first and second fields of the wafer using light from the light source having a multipole pattern comprises exposing the first and second fields of the wafer using light from the light source having a quadrupole pattern.

30. The method of claim 20 wherein the acts of exposing the first and second fields of the wafer using light from the light source comprises exposing the field of the wafer away from the edge of the wafer with light having a first coherency value, and exposing the field of the wafer near the edge of the wafer with light having a second coherency value.

31. The method of claim 30 wherein the first coherency value comprises coherency value of 0.7, and the second coherency value comprises coherency value of 0.6.

32. The method of claim 20 wherein the acts of exposing the first field of the wafer and exposing the second field of the wafer comprise exposing the first and second fields of the wafer with the same light doses.

* * * * *

UNITED STATES PATENT AND TRADEMARK OFFICE
CERTIFICATE OF CORRECTION

PATENT NO. : 6,403,285 B1
DATED : June 11, 2002
INVENTOR(S) : Holscher et al.

It is certified that error appears in the above-identified patent and that said Letters Patent is hereby corrected as shown below:

Column 1,
Line 49, "reticule" should read -- reticle --

Column 2,
Line 30, "widths of the features" should read -- the widths of the features --
Line 60, "reticule" should read -- reticle --

Column 3,
Line 62, "reticule" should read -- reticle --
Line 63, "si of 0.5." should read -- $\sigma_i$ of 0.5 --
Line 64, "so of 0.8" should read -- $\sigma_o$ of 0.8 --
Line 65, "so and si" should read -- $\sigma_o$ and $\sigma_i$ --

Column 4,
Line 4, "reticule" should read -- reticle --
Line 5, "si of 0.4. and a so" should read -- $\sigma_i$ of 0.4 and a $\sigma_o$ --
Line 6, "so and si" should read -- $\sigma_o$ and $\sigma_i$ --
Line 39, "reticule" should read -- reticle --
Line 40, "a s of 0.6." should read -- a $\sigma$ of 0.6. --
Line 41, "of s may be used." should read -- of $\sigma$ may be used. --

Signed and Sealed this

Twenty-eighth Day of January, 2003

JAMES E. ROGAN
*Director of the United States Patent and Trademark Office*